United States Patent
Yun et al.

(10) Patent No.: US 12,324,113 B2
(45) Date of Patent: Jun. 3, 2025

(54) FOLDABLE DISPLAY DEVICE INCLUDING A FOREIGN MATERIAL INFLOW PREVENTION ELEMENT

(71) Applicant: LG Display Co., Ltd., Seoul (KR)

(72) Inventors: YoungJoon Yun, Goyang-si (KR); JiSoon Oh, Goyang-si (KR); Hyeonggwang An, Incheon (KR); ShinSuk Lee, Gimpo-si (KR); ByeongCheol Lee, Cheongju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/970,372

(22) Filed: Oct. 20, 2022

(65) Prior Publication Data
US 2023/0209752 A1    Jun. 29, 2023

(30) Foreign Application Priority Data
Dec. 24, 2021   (KR) .......................... 10-2021-0187582

(51) Int. Cl.
*H05K 5/02*   (2006.01)
*F16C 11/04*   (2006.01)

(52) U.S. Cl.
CPC ............ *H05K 5/0226* (2013.01); *F16C 11/04* (2013.01)

(58) Field of Classification Search
CPC .. H05K 5/0217; H05K 5/0226; G06F 1/1652; G06F 1/1681; G09F 9/301; H04M 1/0268; F16C 11/04
See application file for complete search history.

(56) References Cited

U.S. PATENT DOCUMENTS

| | | | | |
|---|---|---|---|---|
| 8,971,031 B2 * | 3/2015 | Mok | ..................... | G06F 1/1656 |
| | | | | 361/679.27 |
| 9,600,035 B2 * | 3/2017 | Park | ..................... | G06F 1/1681 |
| 10,761,574 B1 * | 9/2020 | Hsu | ..................... | G06F 1/1616 |
| 10,802,551 B1 * | 10/2020 | Lin | ..................... | E05D 3/122 |
| 11,054,869 B2 * | 7/2021 | Moon | ................. | H04M 1/0268 |
| 11,073,863 B2 * | 7/2021 | Kim | ..................... | G06F 1/1656 |
| 12,204,378 B2 * | 1/2025 | Park | ..................... | G06F 1/1652 |

(Continued)

FOREIGN PATENT DOCUMENTS

| | | |
|---|---|---|
| CN | 112770554 A | 5/2021 |
| CN | 115701625 A | 2/2023 |

(Continued)

*Primary Examiner* — Rockshana D Chowdhury
*Assistant Examiner* — Douglas R Burtner
(74) *Attorney, Agent, or Firm* — Birch, Stewart, Kolasch & Birch, LLP

(57) ABSTRACT

A foldable display device includes a first support plate and a second support plate, a display panel disposed on the first support plate and the second support plate and a hinge assembly disposed between the first support plate and the second support plate, the hinge assembly includes a hinge arm, a gear arm coupled to the hinge arm, an inner frame disposed under the hinge arm and the gear arm and fixing the hinge arm and the gear arm, a hinge housing accommodating the inner frame, the hinge arm, and the gear arm, under the inner frame, and a foreign material inflow prevention element interposed between the hinge housing and the inner frame and connected to the hinge arm to operate together with folding of the hinge arm when the hinge arm is folded.

19 Claims, 11 Drawing Sheets

(56) References Cited

U.S. PATENT DOCUMENTS

| | | | |
|---|---|---|---|
| 2008/0148640 A1* | 6/2008 | Marron | F16J 15/3288 |
| | | | 277/355 |
| 2008/0309017 A1* | 12/2008 | Mattice | A46D 1/0238 |
| | | | 277/355 |
| 2009/0231786 A1* | 9/2009 | Takamori | H04M 1/0216 |
| | | | 361/679.01 |
| 2015/0378397 A1* | 12/2015 | Park | G06F 1/1656 |
| | | | 361/679.27 |
| 2019/0278338 A1* | 9/2019 | Siddiqui | G06F 1/1656 |
| 2019/0391618 A1* | 12/2019 | Hsu | G06F 1/1616 |
| 2020/0267858 A1* | 8/2020 | Kim | F16C 11/04 |
| 2020/0382627 A1* | 12/2020 | Park | H04M 1/0216 |
| 2020/0383215 A1* | 12/2020 | Kim | G06F 1/1641 |
| 2020/0409429 A1* | 12/2020 | Hsu | E05D 11/06 |
| 2021/0026406 A1* | 1/2021 | Kim | G06F 1/1656 |
| 2021/0116975 A1 | 4/2021 | Moon | |
| 2021/0191460 A1* | 6/2021 | Lee | G06F 1/1652 |
| 2021/0247815 A1* | 8/2021 | Shim | G06F 1/1641 |
| 2021/0307185 A1* | 9/2021 | Hong | H05K 5/0226 |
| 2021/0307186 A1* | 9/2021 | Hong | H04M 1/0216 |
| 2022/0019266 A1* | 1/2022 | Park | G06F 1/1656 |
| 2022/0019270 A1* | 1/2022 | Su | G06F 1/1681 |
| 2022/0336772 A1* | 10/2022 | Choi | G06F 1/1656 |
| 2022/0342454 A1* | 10/2022 | Wright | H04M 1/17 |
| 2022/0353354 A1* | 11/2022 | Song | H04M 1/022 |
| 2022/0386491 A1* | 12/2022 | Cho | H04M 1/0268 |
| 2023/0004198 A1* | 1/2023 | Kondo | G06F 1/1681 |
| 2023/0021638 A1* | 1/2023 | Yun | G06F 1/1681 |
| 2023/0036915 A1* | 2/2023 | Yang | G06F 1/1652 |
| 2023/0046408 A1* | 2/2023 | Wu | G06F 1/1624 |
| 2023/0057510 A1* | 2/2023 | Park | G06F 1/1688 |
| 2023/0062448 A1* | 3/2023 | Song | H04M 1/02 |
| 2023/0093901 A1* | 3/2023 | Hsu | G06F 1/1616 |
| | | | 361/679.01 |
| 2023/0144645 A1* | 5/2023 | Noh | H04M 1/0254 |
| | | | 361/807 |
| 2023/0164253 A1* | 5/2023 | Xu | G06F 1/1641 |
| | | | 455/566 |
| 2023/0180413 A1* | 6/2023 | An | G06F 1/1652 |
| | | | 345/905 |
| 2023/0209752 A1* | 6/2023 | Yun | G06F 1/1652 |
| | | | 361/807 |
| 2023/0275983 A1* | 8/2023 | Cho | H05K 5/0217 |
| | | | 455/575.4 |
| 2023/0292455 A1* | 9/2023 | Caplow-Munro | G06F 1/1652 |
| 2023/0296129 A1* | 9/2023 | Kim | G06F 1/1681 |
| | | | 361/807 |
| 2023/0315160 A1* | 10/2023 | Schwartzel | G06F 1/1652 |
| | | | 361/679.27 |
| 2023/0333598 A1* | 10/2023 | Yoon | G06F 1/203 |
| 2024/0028086 A1* | 1/2024 | Feng | G06F 1/1652 |
| 2024/0069604 A1* | 2/2024 | Xu | G06F 1/1652 |
| 2024/0219964 A1* | 7/2024 | Cha | G06F 1/1641 |
| 2024/0251518 A1* | 7/2024 | Jo | G06F 1/1652 |
| 2024/0291913 A1* | 8/2024 | Zhang | G06F 1/1652 |
| 2024/0302872 A1* | 9/2024 | Lombardi | G06F 1/1681 |
| 2024/0323269 A1* | 9/2024 | Lin | H04M 1/0214 |
| 2024/0361810 A1* | 10/2024 | Wang | G06F 1/1656 |
| 2024/0361811 A1* | 10/2024 | Zhang | G06F 1/16 |
| 2024/0373566 A1* | 11/2024 | Yu | G06F 1/1641 |
| 2024/0396986 A1* | 11/2024 | Guan | G06F 1/1681 |

FOREIGN PATENT DOCUMENTS

| | | |
|---|---|---|
| KR | 10-2006-0027519 A | 3/2006 |
| KR | 10-2021-0047139 A | 4/2021 |
| WO | WO 2021/025180 A1 | 2/2021 |

\* cited by examiner

FOLDABLE DISPLAY DEVICE INCLUDING A FOREIGN MATERIAL INFLOW PREVENTION ELEMENT

CROSS-REFERENCE TO RELATED APPLICATIONS

This application claims the benefit of and priority to Korean Patent Application No. 10-2021-0187582 filed on Dec. 24, 2021 in the Republic of Korea, the entire contents of which are hereby expressly incorporated by reference into the present application.

BACKGROUND

Technical Field

The present disclosure relates to a foldable display device, and more particularly, to a foldable display device having a hinge structure allowing for inner folding (e.g., inward folding of the foldable display device, so as to reduce the size of the foldable display device in a longitudinal direction).

Discussion of the Related Art

Recently, portable terminals such as wireless terminals, personal digital assistants (PDAS), portable multimedia players (PMPs), and electronic organizers are being reduced in sizes for portability. However, since users want to be provided with various pieces of information such as text information, videos, still images, MP3, and games through a screen (e.g., display unit or display) of the portable terminal, the screen of a display unit is required to be enlarged and greater in size. However, since a reduction in size of the portable terminal leads to a reduction in size of a display screen, there is a limit in satisfying both requirements of a reduced overall terminal size while increasing a size of a screen (e.g., display screen).

As a way to overcome this limit, a flexible display device, such as a bendable display device, a foldable display device, or a roll-slide display device, has recently been developed.

The flexible display device can be implemented by forming a substrate of a plastic material. However, any alternate material can be used as substrate of the flexible display device. Since the flexible display device can be easily carried when folded and can realize (e.g., have) a large screen when unfolded, it can be applied to various fields of application such as televisions and monitors, as well as mobile devices such as mobile phones, e-books, and electronic newspapers.

SUMMARY OF THE DISCLOSURE

The inventors of the present disclosure have invented a structure in which a mechanism that includes a hinge is used in an area where a display panel is folded to implement a foldable display device among flexible display devices. However, the inventors of the present disclosure have recognized the fact that when implementing a folding hinge using only a 4-axis gear (e.g., four general gears), it is infeasible to manufacture a set having a small thickness, or in order to implement a small thickness, a gear size gets small, which reduces durability of the gear and increases the changes of the gear being defective.

Accordingly, the inventors of the present disclosure have invented a foldable display device having a new hinge structure that forms a folding trajectory based on a biaxial rotation structure. In addition, the inventors of the present disclosure have invented a new hinge structure of a foldable display device that includes two bevel gears and a link slider structure for synchronous movement between axes of the two bevel gears during biaxial rotation. In particular, in the foldable display device of the present disclosure, a thickness of the foldable display device can be minimized by using two bevel gears instead of four general gears.

Accordingly, an aspect of the present disclosure is to provide a foldable display device having a hinge structure that allows for inner folding (e.g., folding of the foldable display device in half, or folding of the foldable display device about itself), and is capable of securing durability (e.g., having enhanced durability) without increasing the thickness of the foldable display device.

In addition, the inventors of the present disclosure have realized holding force using friction between components constituting a hinge to maintain a specific folding angle of a foldable display device during folding and unfolding operations of the foldable display device. However, the inventors of the present disclosure have recognized that the holding force required for maintaining a specific folding angle of the foldable display device is reduced due to continuous folding and unfolding operations of the foldable display device. In addition, the inventors of the present disclosure have recognized that, unlike a folder phone (e.g., flip phone of folding phone), a foldable display device is heavy and thus requires high holding force.

Accordingly, the inventors of the present disclosure have developed a new structure of a foldable display device capable of maintaining a specific folding angle of the foldable display device by implementing a holding torque and a free stop function by applying a cam structure, where the cam structure includes including compression springs.

Accordingly, another aspect of the present disclosure is to provide a foldable display device having a new structure in which, holding force can be permanently implemented without a decrease in holding force even when the foldable display device is continuously used and high holding force can be implemented even when the foldable display device is heavy.

In addition, the inventors of the present disclosure have recognized that an escape structure is required to realize (e.g., support) a curvature of a display panel (e.g., a curved portion of a display panel) when a hinge is folded, and impact resistance properties are degraded due to the escape structure.

Accordingly, still another aspect of the present disclosure is to provide a foldable display device with improved impact resistance properties while securing an escape space (e.g., supporting space for a curved/folded portion of a display panel) for realizing a curvature of a display panel when folded.

In addition, the inventors of the present disclosure have recognized that, in a state in which the hinge assembly is folded, foreign materials (e.g., contaminants, such as dust and dirt) flow into a gap between a hinge housing and an inner frame, thereby causing damage to the hinge assembly.

Accordingly, still another object of the present disclosure is to provide a foldable display device in which damage to a hinge assembly is prevented by preventing an inflow of foreign materials.

Objects of the present disclosure are not limited to the above-mentioned objects, and other objects, which are not mentioned above, can be clearly understood by those skilled in the art from the following descriptions.

A foldable display device according to an embodiment of the present disclosure includes a first support plate and a second support plate, a display panel disposed on the first support plate and the second support plate and a hinge assembly disposed between the first support plate and the second support plate, the hinge assembly includes a hinge arm, a gear arm coupled to the hinge arm, an inner frame disposed under the hinge arm and the gear arm and fixing the hinge arm and the gear arm, a hinge housing accommodating the inner frame, the hinge arm, and the gear arm, under the inner frame, and a foreign material inflow prevention element interposed between the hinge housing and the inner frame and connected to the hinge arm to operate together with folding of the hinge arm when the hinge arm is folded.

Other detailed matters of the embodiments are included in the detailed description and the drawings.

According to the present disclosure, impact resistance and durability properties can be improved without an increase in thickness of a foldable display device.

According to the present disclosure, holding force for maintaining a specific folding angle of a foldable display can be implemented.

According to the present disclosure, by improving components of a hinge assembly, durability of a foldable display device can be improved without an increase in costs, and folding reliability can be secured.

According to the present disclosure, damage to a hinge assembly can be prevented by preventing an inflow of foreign materials.

The effects according to the present disclosure are not limited to the contents exemplified above, and more various effects are included in the present specification.

BRIEF DESCRIPTION OF THE DRAWINGS

The present disclosure will become more fully understood from the detailed description given hereinbelow and the accompanying drawings which are given by way of illustration only, and thus are not limitative of the present disclosure.

DETAILED DESCRIPTION OF THE EMBODIMENTS

Hereinafter, various embodiments of the present disclosure will be described in detail with reference to the accompanying drawings.

Figure 1:
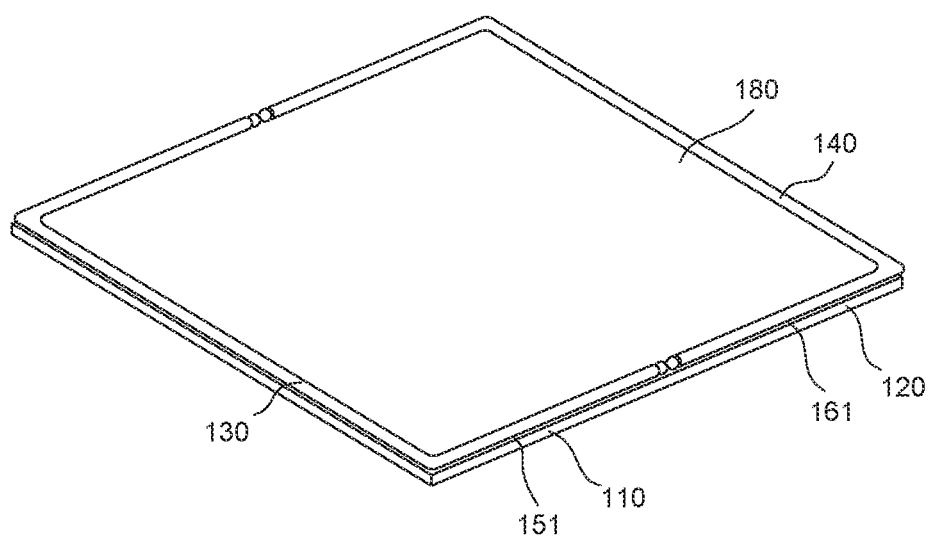
FIG. 1 is a perspective view of a foldable display device according to an embodiment of the present disclosure.

FIG. 1 is a perspective view of a foldable display device according to an embodiment of the present disclosure.

Figure 2:
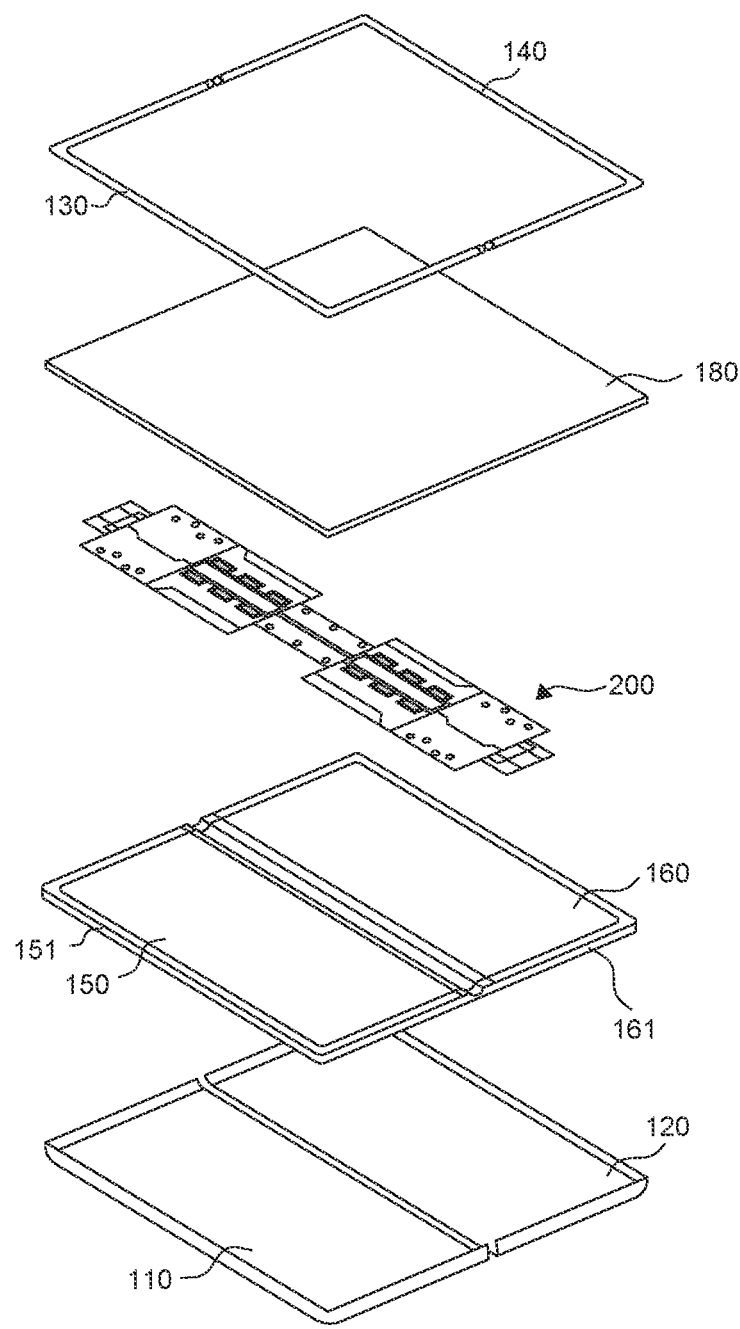
FIG. 2 is an exploded perspective view of the foldable display device according to an embodiment of the present disclosure.

FIG. 2 is an exploded perspective view of the foldable display device according to an embodiment of the present disclosure.

Figure 3:
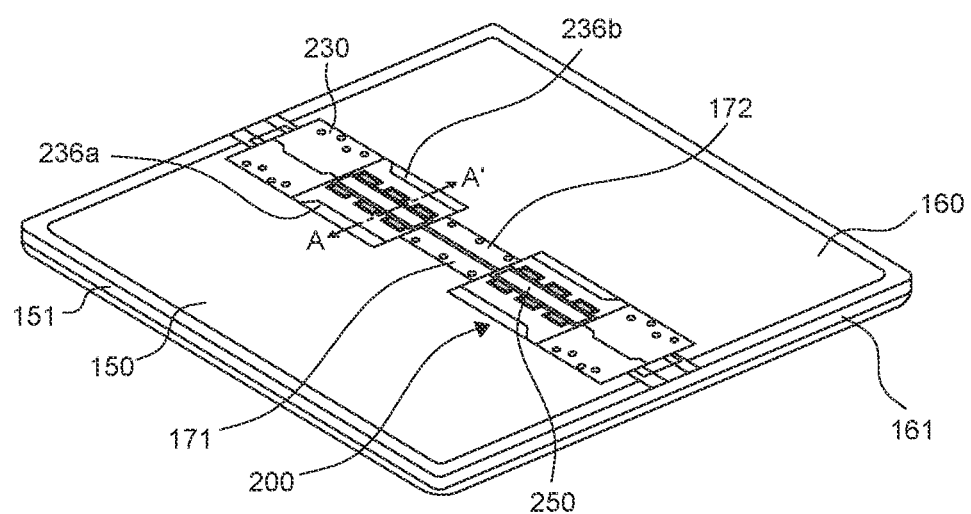
FIG. 3 is a perspective view illustrating a part of a configuration of the foldable display device according to an embodiment of the present disclosure.

FIG. 3 is a perspective view illustrating a part of a configuration of the foldable display device according to an embodiment of the present disclosure.

FIG. 3 illustrates components of a foldable display device 100 according to an embodiment of the present disclosure of FIG. 1 except for a display panel 180 and bezel covers 130 and 140.

Referring to FIGS. 1 to 3, the foldable display device 100 according to an embodiment of the present disclosure can be configured to include set housings 110 and 120, set frames 150, 151, 160 and 161, a hinge assembly 200, the display panel 180, and the bezel covers 130 and 140. Alternatively, the bezel covers 130 and 140 can constitute a single unitary member attached (e.g., fixedly attached or removably attached) to the display panel 180).

The foldable display device 100 according to an embodiment of the present disclosure can further include a hinge support 250 and support covers 171 and 172 provided in the hinge assembly 200.

In addition, the hinge assembly 200 according to an embodiment of the present disclosure can further include foreign material inflow prevention elements 236a and 236b that are interposed between a hinge housing 210 and an inner frame 220.

In FIGS. 1 to 3, components of the foldable display device 100 is illustrated for convenience of explanation, but substantially, various components for driving the foldable display device 100 can be further included.

The set housings 110 and 120 can be disposed under the display panel 180, the hinge assembly 200, and the set frames 150, 151, 160, and 161.

The set housings 110 and 120 are a set of exterior covers, and can include a first cover 110 on a left and a second cover 120 on a right, but the present disclosure is not limited thereto.

The first cover 110 and the second cover 120 can be disposed in (e.g., a first area) one area and the other area in which the foldable display device 100 according to an embodiment of the present disclosure is folded and unfolded. In the foldable display device 100 according to an embodiment of the present disclosure, a folding operation and an unfolding operation are performed based on a boundary area between the first cover 110 and the second cover 120 by external force that is applied by a user.

The first cover 110 and the second cover 120 can be provided to have the same shape.

The set frames 150, 151, 160, and 161 are a set of built-in frames, on which various hardware components of the foldable display device 100 can be mounted and the display panel 180 can be seated.

To this end, the set frames 150, 151, 160, 161 can include a first support plate 150 on the left (e.g., a first lateral side) and a second support plate 160 on the right (e.g., a first lateral side), and a first frame 151 on the left and a second frame 161 on the right, but the present disclosure is not limited thereto. However, the first support plate 150 and the second support plate 160 can be provided as a single unitary member. Further, the single unitary support plate can include an insertion groove for receiving the hinge assembly 200 and the hinge assembly 200 can be flush with a top surface of the support plate.

The first support plate 150 and the second support plate 160 can be separately provided to be folded independently of each other, and the hinge assembly 200 can be provided therebetween.

The support covers 171 and 172 are disposed on an upper portion of the hinge assembly 200 provided between the first support plate 150 and the second support plate 160 to cover a central portion (e.g., central lateral portion) of the hinge assembly 200, but the present disclosure is not limited thereto.

In this case, the support covers 171 and 172 can include a first support cover 171 on the left (e.g., first lateral side) and a second support cover 172 on the right (e.g., second lateral side), but the present disclosure is not limited thereto.

The first frame 151 and the second frame 161 can be separately provided to be folded independently of each other. For instance, the first frame 151 and the second frame 161 can rotate (e.g., about a central hinge axis, independent of one another.

In addition, the first support cover 171 and the second support cover 172 can be separately provided to be folded independently of each other.

The first frame 151 and the second frame 161 can surround and fix (e.g., be attached to) edges of the first bezel cover 130 and the first support plate 150 and edges of the second bezel cover 140 and the second support plate 160, respectively.

In this case, the first support plate 150 and the second support plate 160 can include a first fastening unit and a second fastening unit that are coupled to the hinge assembly 200, respectively.

The first support plate 150 and the second support plate 160 can be provided to have the same shape, and the first fastening unit and the second fastening unit can be disposed to face each other and be symmetrical. However, the first support plate 150 and the second support plate 160 can have different shapes from one another.

A plurality of fastening grooves are formed in the first fastening unit and the second fastening unit, and a plurality of fastening grooves are formed in one surfaces of facing hinge arms 230 of the hinge assembly 200, so that the hinge assembly 200 can be fixed thereto through predetermined fastening elements.

An insertion groove can be formed in a folded portion (e.g., lateral central portion) between the first support plate 150 and the second support plate 160, and the hinge housing 210 of the hinge assembly 200 can be inserted into the insertion groove.

The foldable display device 100 according to an embodiment of the present disclosure is characterized in that it is implemented in an inner folding manner in which a screen unit is disposed internally, when folded.

Meanwhile, the first support plate 150 and the second support plate 160 can be base members (e.g., supporting members) for supporting various components of the foldable display device 100 as well as the display panel 180. Also, the first support plate 150 and the second support plate 160 can accommodate various components for driving the foldable display device 100.

The first support plate 150 and the second support plate 160 according to an embodiment of the present disclosure can be disposed in one area (e.g., a first area) and the other area (e.g., a second area) where the foldable display device 100 is folded and unfolded. For instance, the foldable display device 100 can be folded and unfolded (e.g., onto itself) based on a boundary area between the first support plate 150 and the second support plate 160 by external force that is applied by a user.

The hinge arm 230 can connect the first fastening unit of the first support plate 150 and the second fastening unit of the second support plate 160. In this case, one or more hinge arms 230 of the hinge assembly 200 can be provided in some cases. In FIG. 2, it is illustrated that a pair of the hinge arms 230 are provided on one side (e.g., first end) and the other side (e.g., second side) of the hinge assembly 200, but the present disclosure is not limited thereto.

Specifically, the pair of hinge arms 230 can respectively connect one sides and the other sides (e.g., opposing sides) of the first fastening unit and the second fastening unit.

As described above, the hinge assembly 200 can be disposed at a portion of the foldable display device 100 where the foldable display device 100 is folded and unfolded, so that a folding operation and an unfolding operation of the foldable display device 100 can be facilitated. Also, the hinge assembly 200 can provide a predetermined holding force to maintain the foldable display device 100 in a folded state at a specific angle, or any desired any. For instance, a user can move (e.g., fold) the foldable display device 100 to any position, and the hinge assembly 200 will aid in maintaining that position, In this case, the holding force of the hinge assembly 200 can be provided from a cam structure that includes compression springs, that is, the cam structure can apply the holding force through a frictional force. A detailed structure and function of the hinge assembly 200 will be described later with reference to FIGS. 4 to 9.

The display panel 180 can be disposed on one surface (e.g., a top surface) of both the first support plate 150 and the second support plate 160. As the display panel 180, one of various display panels such s an organic light emitting display panel or a liquid crystal display panel can be used, however, any type of display can be used.

The display panel 180 is a component to display an image to a user and can include a plurality of sub-pixels. In the display panel 180, a plurality of scan lines and a plurality of data lines cross each other, and each of the plurality of sub-pixels can be connected to the scan lines and data lines. In addition, each of the plurality of sub-pixels can be connected to a high potential power line, a low potential power line, an initialization signal line, an emission control signal line, and the like.

The sub-pixels are minimum units constituting a screen, and each of the plurality of sub-pixels can include a light emitting element and a pixel circuit for driving the light emitting element. A plurality of light emitting elements can be defined differently depending on a type of the display panel 180. For example, when the display panel 180 is an organic light emitting display panel, the light emitting element can be an organic light emitting element including an anode, a light emitting unit, and a cathode. Hereinafter, descriptions are made on the assumption that the light emitting element is an organic light emitting element, but a type of the light emitting element is not limited thereto.

The pixel circuit is a circuit for controlling a driving of the light emitting element. The pixel circuit can include, for example, a plurality of transistors and a capacitor, but is not limited thereto.

Also, the display panel 180 can have flexibility so that it can be folded and unfolded along with folding and unfolding of the foldable display device 100.

The foldable display device 100 can be folded such that the first support plate 150 and the second support plate 160 form a specific folding angle. For instance, in FIGS. 1 and 2, it is illustrated that the first support plate 150 and the second support plate 160 are fully unfolded to have an angle of, for example, 180°, but the foldable display device 100 can be folded at any specific angle. In this case, the display panel 180 disposed on the first support plate 150 and the second support plate 160 can also be folded at a specific angle along with folding of the first support plate 150 and the second support plate 160.

Also, the foldable display device 100 can maintain a specific folding angle by the holding force provided from the hinge assembly 200. For instance, the first support plate 150 and the second support plate 160 can be fixed by the hinge assembly 200 while maintaining a specific folding angle, and a user can manipulate the foldable display device 100 to move to the specific folding angle. Accordingly, the foldable display device 100 can be folded at a specific angle according to a user's intention, and can maintain a folded state at a specific angle by the holding force of the hinge assembly 200.

The bezel covers 130 and 140 can cover an upper bezel of the display panel 180 on an upper surface of the display panel 180.

The bezel covers 130 and 140 can include a first bezel cover 110 on the left (e.g., first lateral side) and a second bezel cover 120 on the right (e.g., second lateral side), but the present disclosure is not limited thereto.

Meanwhile, an embodiment of the present disclosure is characterized in that the hinge support 250 in a "T" shape is disposed between a pair of gear arms 240 of the hinge assembly 200. Through an up/down method (e.g., vertical movement) of the hinge support 250, an escape structure for realizing (e.g., supporting) a curvature of the display panel 180 when folded is secured, and at the same time, the gear arms 240 can be supported, thereby improving impact resistance properties of the foldable display device 100.

In addition, an embodiment of the present disclosure is characterized in that the foreign material inflow prevention elements 236a and 236b are interposed between the hinge housing 210 and the inner frame 220 of the hinge assembly 200. The foreign material inflow prevention elements 236a and 236b are connected to the pair of hinge arms 230 and operate together with folding of the hinge arms 230 when the hinge arms 230 are folded, thereby blocking foreign materials from internally flowing (e.g., flowing into the hinge housing 210) after folding.

Hereinafter, a specific structure and function of the hinge assembly 200 including the hinge support 250 and the foreign material inflow prevention elements 236a and 236b will be described in detail with reference to FIGS. 4 to 9.

Figure 4:
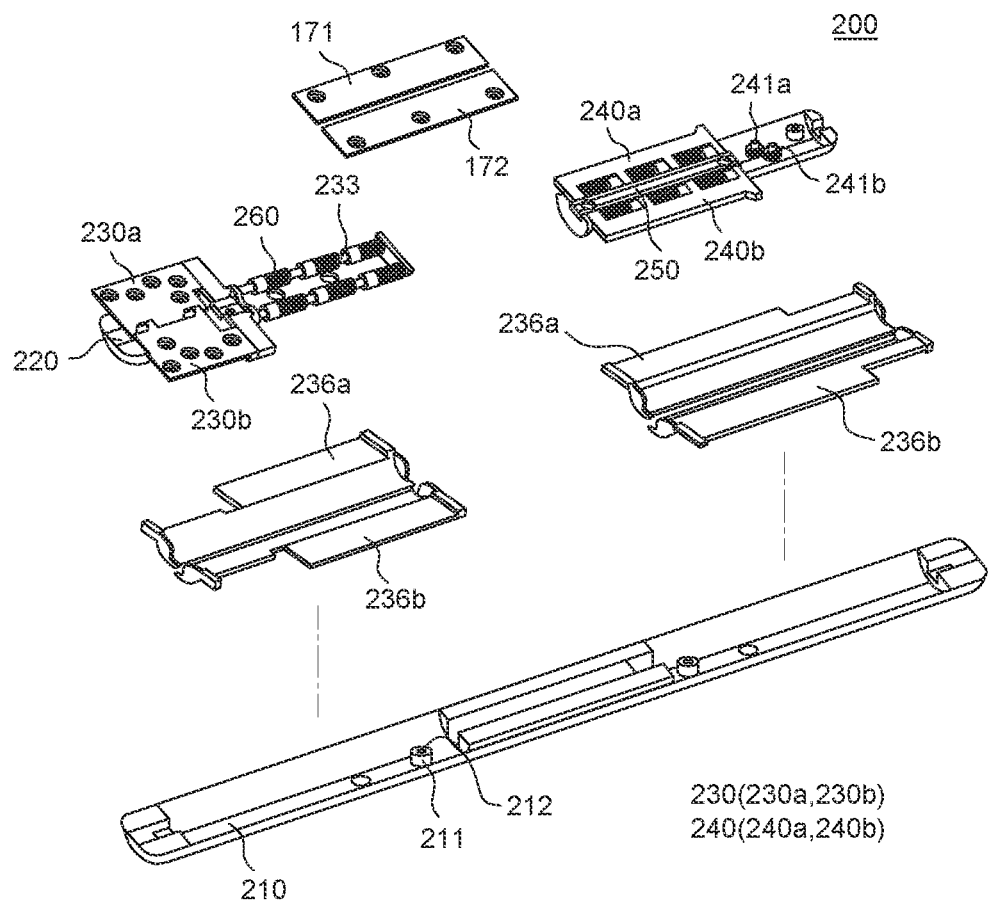
FIG. 4 is an exploded perspective view of a hinge assembly according to an embodiment of the present disclosure.

FIG. 4 is an exploded perspective view of a hinge assembly according to an embodiment of the present disclosure.

Figure 5A:
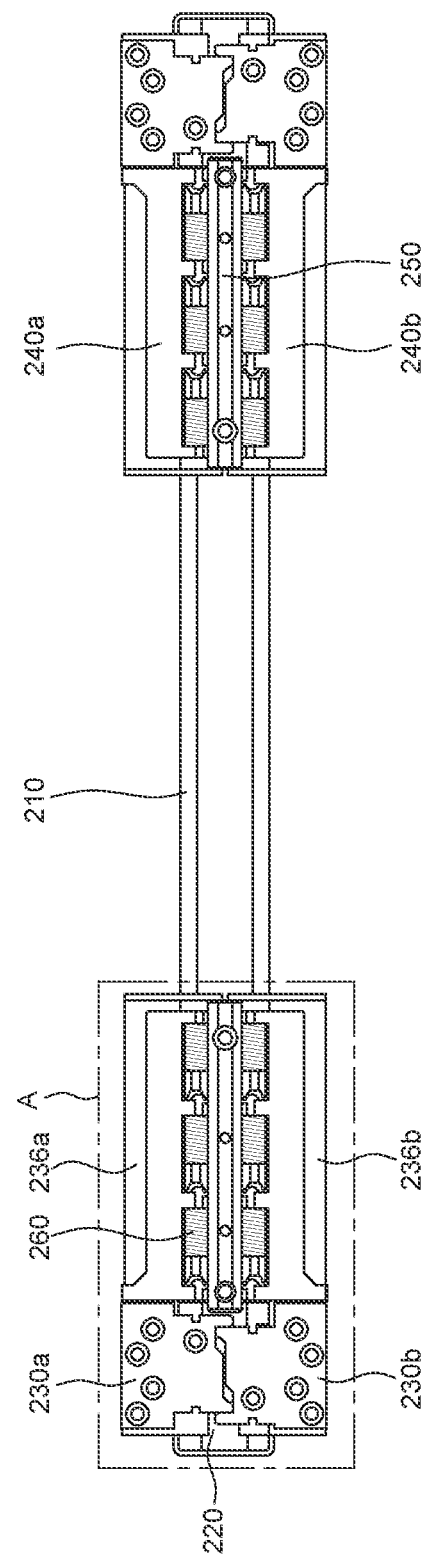
FIG. 5A is a perspective view of the hinge assembly according to an embodiment of the present disclosure.

FIG. 5A is a perspective view of the hinge assembly according to an embodiment of the present disclosure.

Figure 5B:
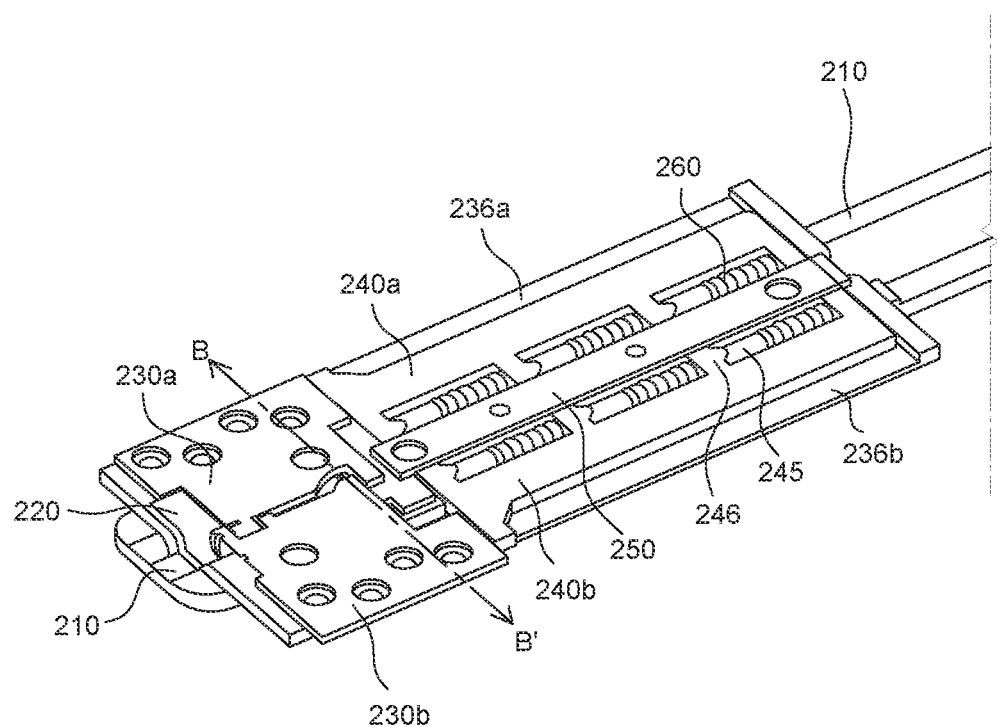
FIG. 5B is an enlarged view of part A of FIG. 5A.

FIG. 5B is an enlarged view of part A of FIG. 5A.

Figure 6:
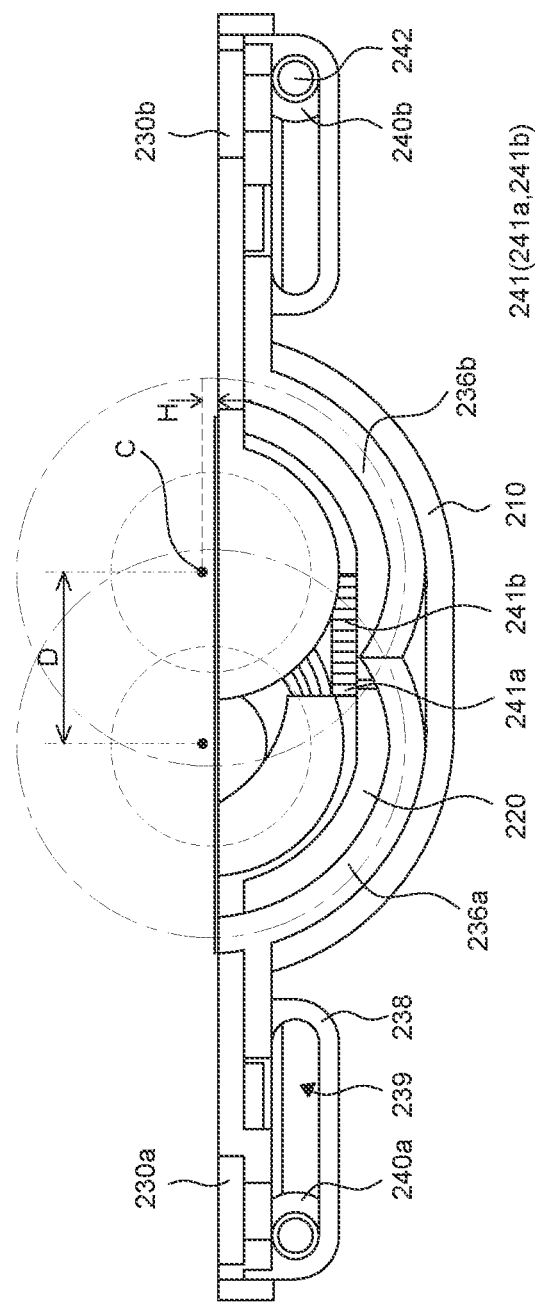
FIG. 6 is a cross-sectional view taken along line B-B' of FIG. 5B.

FIG. 6 is a cross-sectional view taken along line B-B' of FIG. 5B.

Referring to FIGS. 4 to 6, the hinge assembly 200 according to an embodiment of the present disclosure can be configured to include the hinge housing 210, the inner frame 220, the pair of hinge arms 230, and the pair of gear arms 240.

In addition, the hinge assembly 200 according to an embodiment of the present disclosure can further include an upper hinge arm cover and a lower hinge arm cover that are fastened at an upper portion and a lower portion of the hinge arm 230, but the present disclosure is not limited thereto.

In addition, the support covers 171 and 172 are disposed on the upper portion of the hinge assembly 200 to cover the central portion of the hinge assembly 200, but the present disclosure is not limited thereto. Each of the support covers 171 and 172 can include a plurality of holes to allow for connection to the first frame 151 and the second frame 161. That is, a plurality of fasteners corresponding to the plurality of holes of the support covers 171 and 172, and thus the hinge assembly 200, to the first and second support plates 150 and 160).

The support covers 171 and 172 can include a first support cover 171 on the left (e.g., first lateral side) and a second support cover 172 on the right (e.g., second lateral side), but the present disclosure is not limited thereto.

The first frame 151 and the second frame 161 can be separately provided to be folded independently of each other.

The hinge assembly 200 includes the pair of hinge arms 230 on one side thereof, and the pair of hinge arms 230 can be rotatably connected to each other. For instance, the hinge arms 230 can include a first hinge arm 230a and a second hinge arm 230b having a symmetrical structure (e.g., be symmetrically disposed with respect to the first frame 151 and the second frame 161 or an insertion groove formed between the first frame 151 and the second frame 161), but the present disclosure is not limited thereto. Also, the hinge assembly 200 can include the pair of hinge arms 230 on the other side thereof.

The first hinge arm 230a and the second hinge arm 230b can have a structure in which they are symmetrical to each other (e.g., symmetrically disposed).

The hinge arms 230 according to an embodiment of the present disclosure is characterized by having a biaxial folding (rotation) structure. For instance, when implementing a folding hinge using a 4-axis gear, it is infeasible to manufacture a gear set having a small thickness, or in order to implement a small thickness, a gear size gets small and durability can be effected, which can cause a defect in the gear set. Accordingly, the present disclosure is characterized by the foldable display device 100 having a new hinge structure that forms a folding trajectory based on a biaxial rotation structure. For instance, the present disclosure is characterized by the foldable display device 100 having a biaxial (e.g., or multi-axial) folding hinge structure that can be folded in an inner direction in a foldable product. In addition, the present disclosure is characterized by a new hinge structure of the foldable display device 100 with two bevel gears 241 (241a, 241b) and a link slider structure for sync between axes during biaxial rotation. The hinge arm 230 is a biaxial folding lever and can be referred to as a lever wing.

The bevel gear 241 can be a gear for sync of the hinge arm 230 of biaxial folding. Accordingly, the bevel gear 241 can be referred to as a sync gear.

The bevel gears 241 can include a first bevel gear 241a coupled to the first hinge arm 230a and a second bevel gear 241b coupled to the second hinge arm 230b.

The first bevel gear 241a and the second bevel gear 241b can have a virtual axis different from a rotation axis C which is an actual axis. For instance, the first bevel gear 241a and the second bevel gear 241b can have a virtual axis substantially perpendicular to the rotation axis C.

Each of a first tooth portion and a second tooth portion formed in the first bevel gear 241a and the second bevel gear 241b can be formed only in a portion of circumference, but the present disclosure is not limited thereto.

The first bevel gear 241a and the second bevel gear 241b can be disposed to mesh with each other. However, the present disclosure is not limited thereto, and the first bevel gear 241a and the second bevel gear 241b can mesh with a first rotation gear and a second rotation gear, respectively, and the first rotation gear and the second rotation gear can be configured to mesh with each other.

Left and right synchronization can be maintained through two sync gears 241 of the present disclosure, that is, the first bevel gear 241a and the second bevel gear 241b.

The first bevel gear 241a and the second bevel gear 241b can include second idle gears that mesh with first idle gears of the respective first hinge arm 230a and second hinge arm 230b in order to convert and transmit rotation of each of the first hinge arm 230a and the second hinge arm 230b in a perpendicular direction. A rotation direction of the second idle gears of the first bevel gear and the second bevel gear rotate is perpendicular to a rotation direction of the first idle gears of the first hinge arm and the second hinge arm.

At ends (e.g., lateral ends) of the first gear arm 240a and the second gear arm 240b, sliding pins 242 that respectively protrude toward the first hinge arm 230a and the second hinge arm 230b are provided, and protrusions 238 of the first hinge arm 230a and the second hinge arm 230b facing the first gear arm 240a and the second gear arm 240b can include sliding spaces 239 through which the sliding pins 242 are movable. For instance, each of the first hinge arm 230a and the second hinge arm 230b include a protrusion 238, and each protrusion 238 includes a sliding space 239. The first gear arm 240a includes a sliding pin 242 that extends into and slides within the sliding space 239 of the first hinge arm 230a during a folding operation and the unfolding operation, and the second gear arm 240b includes a sliding pin 242 that extends into and slides within the sliding space 239 of the second hinge arm 230b during the folding operation and the unfolding operation. Accordingly, during a folding operation or an unfolding operation of the foldable display device 100, the sliding pins 242 move within the sliding spaces 239, and the first gear arm 240a and the second gear arm 240b can rotate in conjunction with the rotations of the first hinge arm 230a and the second hinge arm 230b, A detailed description thereof will be described later with reference to FIGS. 7A and 7B and FIGS. 8A and 8B.

The gear arms 240 can be rotatably fastened to shafts.

The gear arms 240 can be referred to as biaxial folding detents and can also be referred to as lever detents.

For instance, the gear arms 240 can be configured to include the first gear arm 240a and the second gear arm 240b, and the first hinge arm 230a and the second hinge arm 230b can be fastened to interlock with the first gear arm 240a and the second gear arm 240b, respectively.

The gear arms 240 can be link configurations connected to the biaxial hinge arms 230. For instance, the first gear arm 240a and the second gear arm 240b can be connected to the first hinge arm 230a and the second hinge arm 230b, respectively. Accordingly, during a folding operation or an unfolding operation of the foldable display device 100, the first hinge arm 230a and the second hinge arm 230b can rotate together with the rotations of the first gear arm 240a and the second gear arm 240b, and left and right synchronization can be maintained by the first bevel gear 241a and the second bevel gear 241b connected to the first hinge arm 230a and the second hinge arm 230b, respectively.

As such, the first hinge arm 230a and the second hinge arm 230b can interlock with the first gear arm 240a and the second gear arm 240b, respectively.

The shafts can constitute frames for seating and assembling of cams 245.

Compression springs 260 for implementing frictional force of the cams 245 can be provided on outer surfaces of the shafts between the gear arms 240 and the cams 245.

On the gear arms 240 fastened to the outer surfaces of the shafts, second detents 246 for maintaining folding and unfolding angles of the hinge arms 230 and the gear arms 240 together with a plurality of the cams 245 can be provided. Accordingly, the cam 245 can be a component for torque of folding and unfolding of the hinge arm 230. The cam 245 can also be referred to as a slide cam.

Meanwhile, a predetermined hinge housing 210 that accommodates the inner frame 220, the hinge arms 230, and the gear arms 240 can be provided in a lower portion of the hinge assembly 200.

The hinge housing 210 is an exterior cover of the hinge assembly 200, has a predetermined length, and can have a space therein to accommodate the inner frame 220, the hinge arms 230, and the gear arms 240 in the space. The hinge housing 210 can also be referred to as a hinge cover.

The inner frame 220 can be a frame for fixing an inside of the hinge assembly 200. The inner frame 220 can include a plurality of fastening grooves (not shown) and through grooves (not shown). The inner frame 220 is an exterior cover accommodating the pair of first and second bevel gears 241a and 241b, and can also be referred to as a housing cover.

In addition, fixing members 211 that face the fastening grooves of the inner frame 220 are formed in the hinge housing 210, and fixing grooves (or fixing holes) 212 are formed in the fixing members 211, so that the fixing members 211 can be fastened and fixed to the fastening grooves through fastening members such as screws.

The hinge housing 210 can have a predetermined size, and thus, the inner frame 220, the hinge arms 230, and the gear arms 240 can be accommodated in the space of the hinge housing 210.

Meanwhile, a distance between rotation centers of a pair of the shafts can be formed greater than a distance D between rotation axes C, which are the rotation centers of the pair of hinge arms 230. In this case, a pair of virtual axes passing through the centers of the pair of shafts can serve as a central axis to which components constituting the hinge housing 210 are coupled. The pair of virtual axes can be provided to correspond to the first cover and the second cover, respectively.

In this case, an axial height H can exist between a folded portion in which the first hinge arm 230a and the second hinge arm 230b are in contact with the display panel, and the rotation axis C, but the present disclosure is not limited thereto.

Meanwhile, as described above, an embodiment of the present disclosure is characterized in that the hinge support 250 in a "T" shape is disposed between the first gear arm 240a and the second gear arm 240b of the hinge assembly 200. However, the hinge support 250 can have any shape, and can fully encompass an area between the first gear arm 240a and the second gear arm 240b. Through the up/down method (e.g., vertical movement) of the hinge e support 250, an escape structure for realizing the curvature of the display panel when folded is secured and at the same time, the first gear arm 240a and the second gear arm 240b can be supported, thereby improving impact resistance properties.

The hinge support 250 can be disposed in the inner frame 220 between the first gear arm 240a and the second gear arm 240b in a longitudinal direction of the inner frame 220.

The hinge support 250 can have a "T"-shape with an upper end protruding to both sides thereof. For instance, for example, the hinge support 250 can have a "T"-shape in cross-section cut in a direction perpendicular to the longitudinal direction.

The hinge support 250 can have an empty inner space, for accommodating the display panel 180, but is not limited thereto.

The hinge support 250 can support a folding portion (e.g., a folded portion) of the display panel 180.

A current foldable display device needs an escape structure to realize the curvature of the display panel when the hinge is folded, and impact resistance properties can be degraded (e.g., reduced) due to the escape structure. For instance, conventionally, a gap exists between the folding portion of the display panel and the hinge assembly in order to implement an R shape (e.g., "U" shape or curved shape) of the display panel when folded, so that impact resistance properties, such as puncture resistance and ball drop resistance) are weakened, such that the foldable displace device is vulnerable to impact and puncture.

Accordingly, an embodiment of the present disclosure is characterized in that the hinge support 250 in a "T"-shape is disposed between the first gear arm 240a and the second gear arm 240b of the hinge assembly 200, so that an escape space for realizing the curvature of the display panel is formed by lowering the hinge support 250 during folding and the folding portion of the display panel is supported by raising the hinge support 250 during unfolding.

In addition, an embodiment of the present disclosure is characterized in that the foreign material inflow prevention elements 236a and 236b are interposed between the hinge housing 210 and the inner frame 220 of the hinge assembly 200.

The foreign material inflow prevention elements 236a and 236b can include first foreign material inflow prevention elements 236a on a left (e.g., first lateral side) and second foreign material inflow prevention elements 236b on a right (e.g., second lateral side), but the present disclosure is not limited thereto.

The first foreign material inflow prevention element 236a and the second foreign material inflow prevention element 236b can be separately provided to be folded independently of each other.

The first foreign material inflow prevention element 236a and the second foreign material inflow prevention element 236b are connected to the first hinge arm 230a and the second hinge arm 230b, respectively, and operate together with folding of the first hinge arm 230a and the second hinge arm 230b when the first hinge arm 230a and the second hinge arm 230b are folded, thereby blocking foreign materials from internally flowing after folding.

The first foreign material inflow prevention element 236a and the second foreign material inflow prevention element 236b can be formed such that a portion thereof in which the first gear arm 240a and the second gear arm 240b are disposed has a larger area than a portion thereof in which the first hinge arm 230a and the second hinge arm 230b are disposed, but the present disclosure is not limited thereto.

The first foreign material inflow prevention element 236a and the second foreign material inflow prevention element 236b have a central portion having a curvature along (e.g., overlapping and directly contacting) a curvature of an outside of the inner frame 220 so that the inner frame 220 is accommodated therein, and both sides of the first foreign material inflow prevention element 236a and the second foreign material inflow prevention element 236b on which the first gear arm 240a and the second gear arm 240b are disposed can have flat surfaces so that the first gear arm 240a and the second gear arm 240b are seated thereon. Further, a curved inner portion (e.g., central portion) of the first foreign material inflow prevention element 236a and the second foreign material inflow prevention element 236b can fit into curved portions (e.g., curved sides) of the hinge housing 210

Meanwhile, as described above, the present disclosure is characterized by having a link slider structure as well as two bevel gears 241a and 241b for synchronization between axes during biaxial rotation, which will be described in detail with reference to FIGS. 7A and 7B to FIG. 8A and FIG. 8B.

Figure 7A:
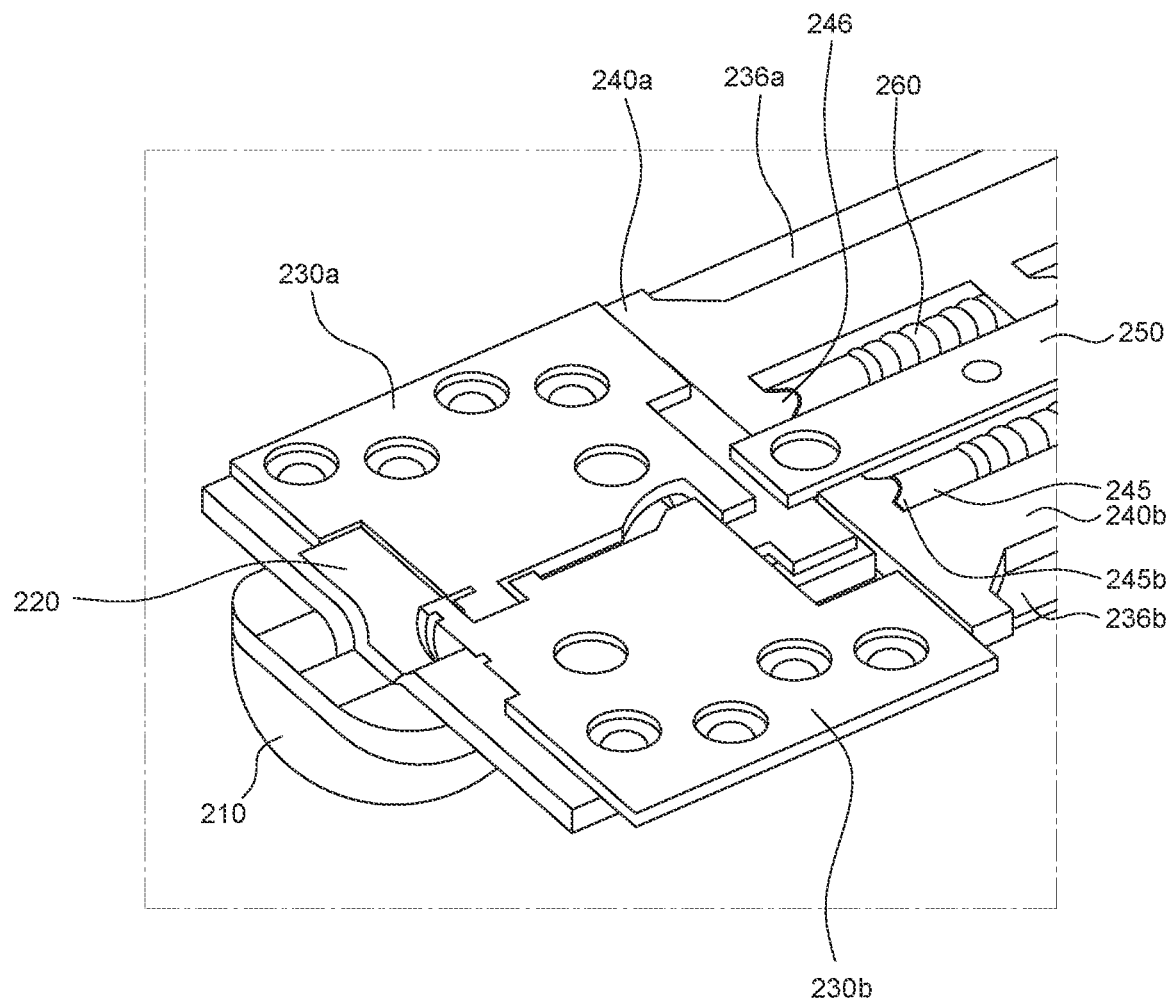
FIG. 7A is a perspective view illustrating an unfolded state of the hinge assembly.

FIG. 7A is a perspective view illustrating an unfolded state of the hinge assembly.

Figure 7B:
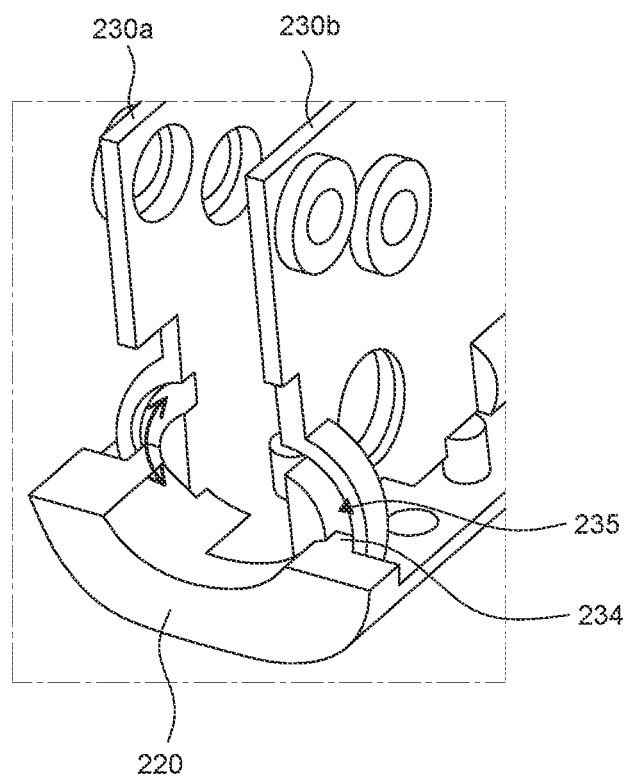
FIG. 7B is a perspective view illustrating a folded state of the hinge assembly.

FIG. 7B is a perspective view illustrating a folded state of the hinge assembly.

Figure 8A:
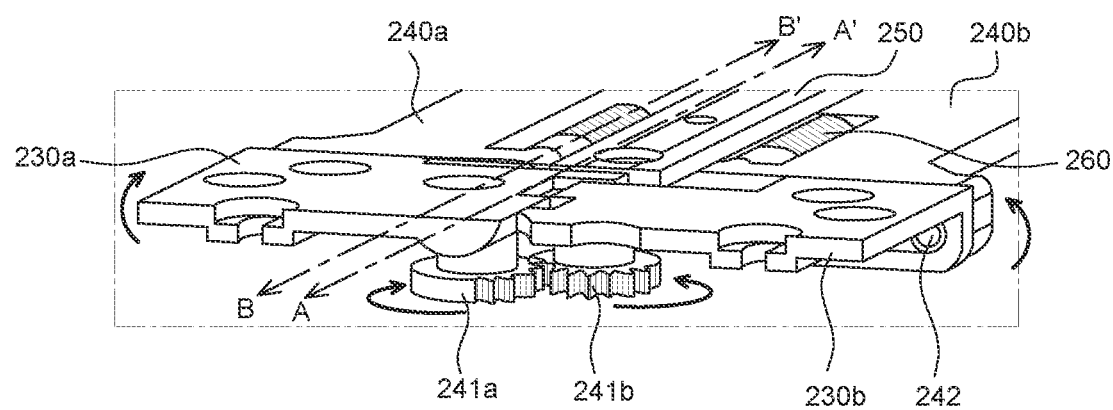
FIG. 8A is another perspective view illustrating an unfolded state of the hinge assembly.

FIG. 8A is another perspective view illustrating an unfolded state of the hinge assembly.

Figure 8B:
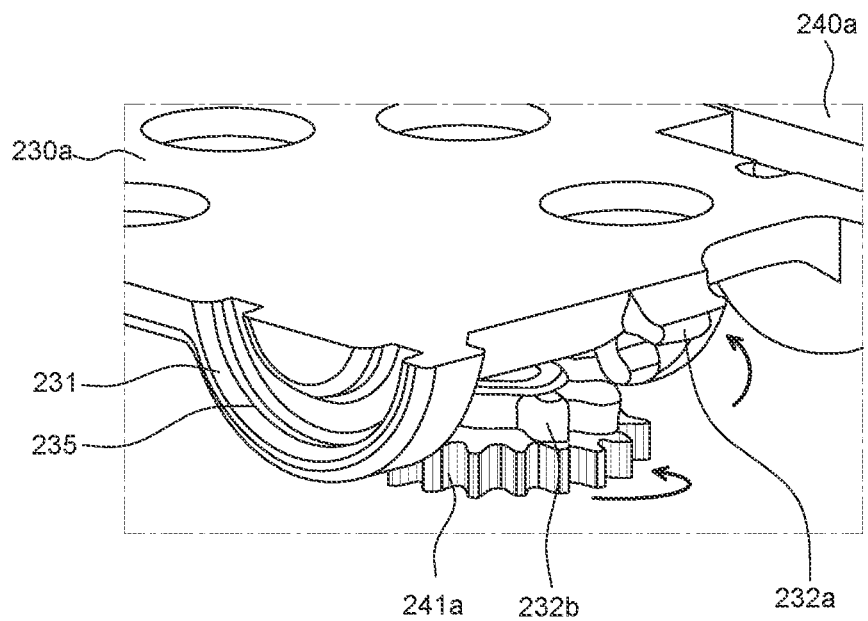
FIG. 8B is an enlarged view of a part of FIG. 8A.

FIG. 8B is an enlarged view of a part of FIG. 8A.

FIGS. 8A and 8B show, as an example, a cut-away perspective view of the hinge assembly cut along line B-B' of FIG. 5B.

FIGS. 7B and 8A and 8B show a part of a configuration of the hinge assembly, in which the hinge housing 210 and the inner frame 220 are omitted for convenience of description. In addition, in FIG. 8A, an illustration of the first hinge arm 230a and the second hinge arm 230b is omitted for convenience of description.

Referring to FIGS. 7A and 7B and FIGS. 8A and 8B, the hinge assembly can be configured to include the hinge housing 210, the inner frame 220, the first and second hinge arms 230a and 230b, and the first and second gear arms 240.

The hinge assembly according to an embodiment of the present disclosure can further include the upper hinge arm cover and the lower hinge arm cover that are fastened at the upper and lower portions of the first and second hinge arms 230a and 230b.

The hinge assembly can include the pair of hinge arms 230a and 230b, and the hinge arms 230a and 230b can include the first hinge arm 230a and the second hinge arm 230b that are symmetrical to each other.

The first hinge arm 230a and the second hinge arm 230b according to an embodiment of the present disclosure are characterized by having a biaxial folding (rotation) structure.

In this case, the first hinge arm 230a and the second hinge arm 230b can be folded (e.g., rotated) along a folding trajectory of the housing cover rail 235 (refer to the arrow of FIG. 7B indicating a path of the hinge arms 230a, 230b).

For instance, a pair of guide pins 234 that protrude toward the first hinge arm 230a and the second hinge arm 230b that are inside (e.g., the guide pins 234 can be disposed within the first hinge arm 230a and the second hinge arm 230b) can be provided at an upper end of the inner frame 220, and a pair of housing cover rails 235 into which the pair of guide pins 234 are fitted can be provided on the first hinge arm 230a and the second hinge arm 230b that face the pair of guide pins 234, but the present disclosure is not limited thereto. Accordingly, the first hinge arm 230a and the second hinge arm 230b can be folded (e.g., rotated) along the folding trajectory of the housing cover rail 235 while being guided by the pair of guide pins 234.

In addition, an embodiment of the present disclosure is characterized by having two bevel gears 241a and 241b and a link slider structure for synchronization between axes during biaxial rotation.

In particular, in the foldable display device of the present disclosure, a thickness of the foldable display device can be minimized by using two bevel gears 241a and 242a instead of four general gears.

For instance, when left and right synchronization is adjusted with four general gears, a thickness of the hinge assembly can be increased by a thickness of four gears that are vertically disposed. Accordingly, in an embodiment of the present disclosure, the thickness and weight of the hinge assembly can be reduced by adjusting the left and right synchronization with the two bevel gears 241a and 241b. In addition, folding of an R value (e.g., a radius) that is smaller than an existing case can be enabled.

Specifically, the bevel gears 241 can include the first bevel gear 241a coupled to the first hinge arm 230a and the second bevel gear 241b coupled to the second hinge arm 230b.

The first bevel gear 241a and the second bevel gear 241b can have a virtual axis different from the rotation axis C, which is an actual rotation axis. For instance, the first bevel gear 241a and the second bevel gear 241b can have a virtual axis substantially perpendicular to the rotation axis c.

Each of the first tooth portion and the second tooth portion formed in the first bevel gear 241a and the second bevel gear 241b, respectively, can be formed only in a portion of a circumference, but the present disclosure is not limited thereto.

The first bevel gear 241a and the second bevel gear 241b can be disposed to mesh with each other. However, the present disclosure is not limited thereto, and the first bevel gear 241a and the second bevel gear 241b can mesh with the first rotation gear and the second rotation gear, respectively, and the first rotation gear and the second rotation gear can be configured to mesh with each other.

The first bevel gear 241a and the second bevel gear 241b can include second idle gears 232b that mesh with first idle gears 232a of the respective first hinge arm 230a and second hinge arm 230b in order to convert and transmit rotation of each of the first hinge arm 230a and the second hinge arm 230b in a perpendicular direction (refer to FIGS. 8A and 8B). The first idle gears 232a can have an orientation that is perpendicular to the orientation of the second idle gears 232b.

In this case, the first idle gear 232a and the second idle gear 232b can be disposed in a substantially perpendicular direction to convert the rotation in the perpendicular direction. For instance, the first bevel gear 241a and the second bevel gear 241b are respectively rotatably fastened to the first idle gears 232a of the first hinge arm 230a and the second hinge arm 230b through the second idle gears 232b, and the first hinge arm 230a and the second hinge arm 230b are slidably fastened (e.g., and fastened via a gear connection between the first idle gears 212a and the second idle gears 232b) to the first gear arm 240a and the second gear arm 240b, respectively, so that a folding operation and an unfolding operation of the foldable display device 100 can be performed while left and right synchronization is maintained.

For instance, when the first hinge arm 230a and the second hinge arm 230b are folded/unfolded in the perpendicular direction, the first bevel gear 241a and the second bevel gear 241b (e.g., due to their physical connection to the hinge arms 230a, 230b) rotate in a horizontal direction, thereby adjusting (e.g., maintaining) synchronization.

Meanwhile, the rotation axes C of the first hinge arm 230a and the second hinge arm 230b and a pair of virtual axes B passing through the centers of the pair of shafts can be different from each other. For instance, the rotation axes C about which the first hinge arm 230a and the second hinge arm 230b are folded/unfolded and the virtual axes B about which the first gear arm 240a and the second gear arm 240b are folded/unfolded do not coincide with each other, and they can be connected with a link slide structure and thus, interlock with each other.

In addition, the virtual axes B about which the first gear arm 240a and the second gear arm 240b are folded/unfolded are the central axes of the shafts, and the rotation axes C about which the first hinge arm 230a and the second hinge arm 230b are folded/unfolded are central axes of the housing cover rails 235. Two different folding/unfolding axes can be connected with a link slide structure so that they interlock with each other.

For instance, an embodiment of the present disclosure is characterized in that two first bevel gear 241a and second bevel gear 241b are provided for synchronization between shafts during biaxial rotation, while the first gear arm 240a and the second gear arm 240b are slidably fastened to the first hinge arm 230a and the second hinge arm 230b, respectively.

For instance, at the ends (e.g., lateral ends) of the first gear arm 240a and the second gear arm 240b, the sliding pins 242 protruding toward the first hinge arm 230a and the second hinge arm 230b are respectively provided. The sliding spaces 239 in which the sliding pins 242 are movable can be provided in the first hinge arm 230a and the second hinge arm 230b that face the first gear arm 240a and the second gear arm 240b. Accordingly, during a folding operation or an unfolding operation of the foldable display device, the sliding pins 242 move within the sliding spaces 239 of the first gear arm 240a and the second gear arm 240b, and the first gear arm 240a and the second gear 240b can rotate (e.g., or be arm folded/unfolded) in conjunction with rotations (e.g., or folding/unfolding) of the first hinge arm 230a and the second hinge arm 230b. As described above, a biaxial hinge operation can be synchronized through two first bevel gear 241a and second bevel gear 241b and a link slider structure.

In this case, the sliding spaces 239 can be provided in the protrusions 238 of the first hinge arm 230a and the second hinge arm 230b, but the present disclosure is not limited thereto.

Meanwhile, the present disclosure is characterized by implementing holding force using frictional force between components constituting the hinge in order to maintain a specific folding angle of the foldable display device during a folding operation and an unfolding operation of the foldable display device.

For instance, the hinge assembly according to the present disclosure can be disposed at a portion where the foldable display device is folded and unfolded to thereby facilitate a folding operation and an unfolding operation of the foldable display device. Also, the hinge assembly according to the present disclosure can provide holding force to maintain the foldable display device in a folded state at a specific angle.

As described above, the display panel can be disposed on one surface of the first support plate and the second support plate. As the display panel, one of various display panels such as an organic light emitting display panel and a liquid crystal display panel can be used. Also, the display panel can have flexibility so that it can be folded and unfolded together with folding and unfolding of the foldable display device.

The foldable display device can be folded such that the first support plate and the second support plate form a specific folding angle. For instance, although it is illustrated that the first hinge arm 230a and the second hinge arm 230b are fully unfolded to have an angle of, for example, 180° in FIGS. 7A and 8A, the foldable display device can be folded at a specific angle. For instance, in FIG. 7B, it is illustrated that the first hinge arm 230a and the second hinge arm 230b are in a folded state to have an angle of 90°, for example, but the present disclosure is not limited thereto. In this case, the display panel as well as the first support plate and the second support plate disposed on upper portions of the first hinge arm 230a and the second hinge arm 230b can also be folded together with folding of the first hinge arm 230a and the second hinge arm 230b.

The foldable display device 100 can be folded at a specific angle according to a user's intention. Also, the foldable display device can be completely folded or unfolded according to a user's intention (e.g., by user manipulation of the foldable display device 100. The foldable display device is capable of inner folding (e.g., in-folding) and folded or unfolded so that the display panel is disposed on an inside thereof, and is capable of out-folding and folded or unfolded so that the display panel 180 is disposed on an outside thereof.

The foldable display device 100 can maintain a specific folding angle by holding force provided from the hinge assembly. In other words, the first hinge arm 230a and the second hinge arm 230b and the first support plate 150 and the second support plate 160 can be fixed in a state in which they maintain a specific folding angle by the hinge assembly. Accordingly, the foldable display device 100 can be folded at a specific angle according to a user's intention (e.g., by user manipulation of the foldable display device 100), and can maintain a folded state at a specific angle by the holding force of the hinge assembly 200, for example, due to a frictional force caused by the cams 245. Further, any number of cams 245 can be provided.

In particular, the present disclosure is characterized in that a specific folding angle of the foldable display device can be maintained by implementing holding torque and a free stop function through a structure of the cam 245, which includes the compression spring 260.

For instance, the holding torque and the free stop function can be implemented by applying the compression spring 260 and the cam structure 245 during an open or close rotation.

Specifically, the hinge assembly 200 of the present disclosure can include a pair of cam structures 245 functioning as a free stop hinge, for example, can be formed of a first cam structure of the cam 245 and a second cam structure of the first gear arm 240a and the second gear arm 240b.

In this case, the free stop hinge means a hinge device that does not provide stopping force at 180 degrees during opening and closing operations of the foldable display device, and means that the foldable display device does not receive stopping force from the hinge device except at 0 degrees and 360 degrees.

The first and second cam structures 245 can be configured as rotating cams. However, the present disclosure is not limited thereto, and one cam structure among the first and second cam structures can be configured as a rotating cam, and the other cam structure can be configured as a sliding cam. The first cam structure and the second cam structure can support a stop state of the foldable display device while performing a cam operation with cam surfaces facing each other. The cam operation provides force for the compression springs 260 to be in close contact with each other and is possible through the cam operation of rotation and/or sliding of the first cam structure and the second cam structure.

The first cam structure employed in the hinge assembly according to an embodiment of the present disclosure is configured as the cam 245 including a body and a first detent 245b provided on one surface of the body, and the second cam structure can include a second detent 246 provided on one surface of the first gear arm 240a and the second gear arm 240b. Each first detent 245b can engage a respective second detent 246 and can have a shape corresponding to the second detent 246. Further, each first detent 245b can have a concave shape that at least substantially matches a convex shape of the respective second detent 246.

At the center of the body of the cam 245, a first hinge hole for inserting the shaft can be formed in an axial direction (e.g., longitudinal direction) of the shaft.

In addition, at a center of the first gear arm 240a and the second gear arm 240b, a second hinge hole for inserting the shaft can be formed in the axial direction (e.g., longitudinal direction) of the shaft.

In addition, the first detent 245b can have a protruding shape in a mountain shape (e.g., a reverse "U" shape), and can protrude from the body in a direction of the first gear arm 240a and the second gear arm 240b. The second detent 246 can have a protruding shape in a mountain shape (e.g., a "U" shape), and can protrude from the first gear arm 240a and the second gear arm 240b toward the cam 245. However, the present disclosure is not limited thereto.

A plurality of first detents 245b can be provided at predetermined intervals with respect to the first hinge hole. A plurality of second detents 246 can be provided at predetermined intervals with respect to the second hinge hole. The plurality of first detents 245b and the plurality of second detents 246 can be disposed at positions facing each other.

Meanwhile, the cam structures of the present disclosure can allow for an increase in the number of the first cam structures and the second cam structures in order to increase torque applied by the cam structures and thus a holding force of the hinge assembly 200.

For instance, the present disclosure is characterized in that the first cam structure and the second cam structure are disposed in the number of 2×3 (refer to FIGS. 5A and 5B). Accordingly, it is possible to secure sufficient friction torque even with a small part at a thin thickness of the hinge assembly.

As described above, by applying the cam structures of 2×3, a leaf spring for assisting free stop is not required, thereby preventing generation of dust due to the leaf spring and preventing breakage of parts. For instance, when a leaf spring is used in a foldable display device, as in the related art, gaps are provided, which allows for the intrusion of dust and other contaminants. Accordingly, it is possible to secure folding reliability.

In addition, as described above, an embodiment of the present disclosure is characterized in that the first foreign material inflow prevention element 236a and the second foreign material inflow prevention element 236b are interposed between the hinge housing 210 and the inner frame 220 of the hinge assembly 200 and operate together with folding of the first hinge arm 230a and the second hinge arm 230b when the first hinge arm 230a and the second hinge arm 230b are folded, thereby blocking foreign materials from internally flowing after folding. For instance, the first foreign material inflow prevention element 236a and the second foreign material inflow prevention element 236*b* provide a seal (e.g., dust seal) to block dust and other contaminants, thereby enhancing the reliability of the hinge assembly 200 of the present invention. This will be described in detail with reference to FIG. 9.

Figure 9:
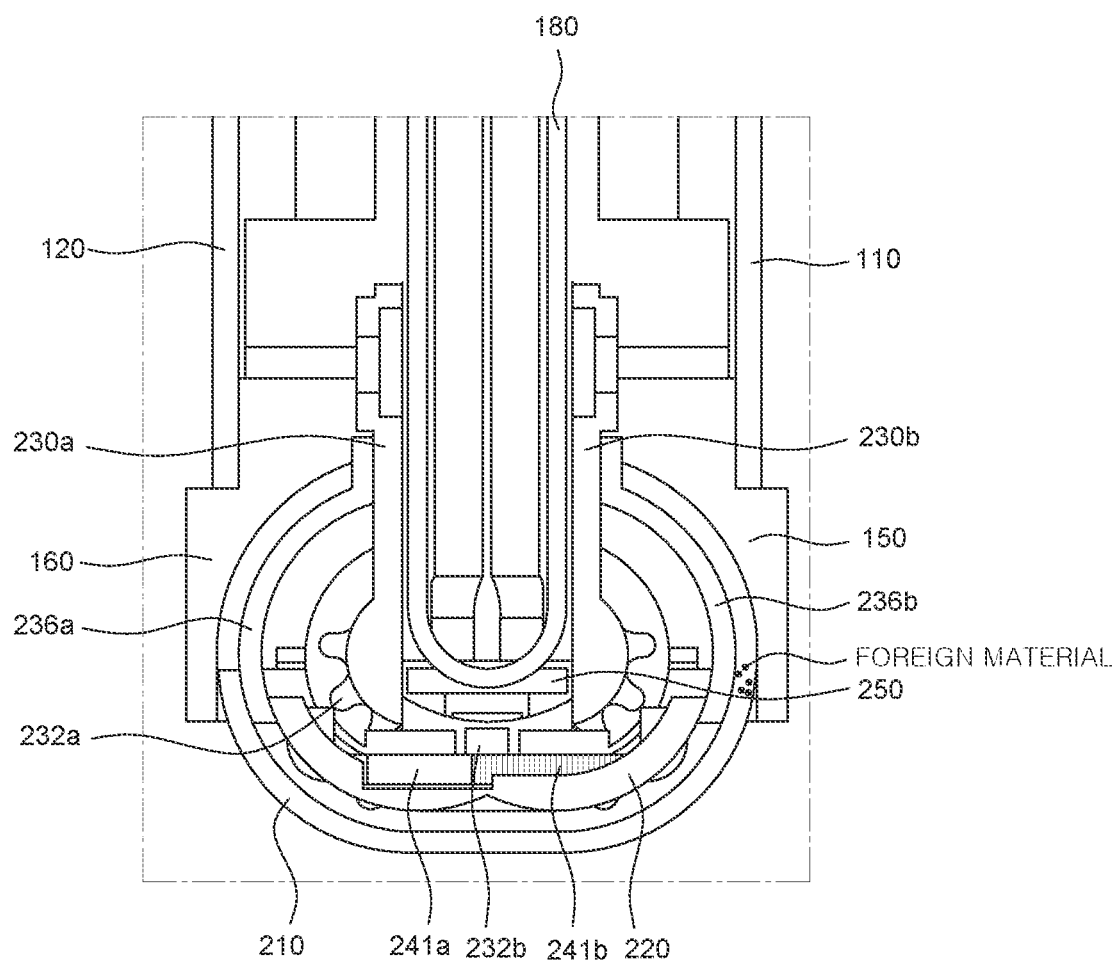
FIG. 9 is a cut-away perspective view illustrating a folded state of the foldable display device according to an embodiment of the present disclosure.

FIG. 9 is a cut-away perspective view illustrating a folded state of the foldable display device according to an embodiment of the present disclosure.

Referring to FIG. 9, the set housing 110 can be disposed under the hinge assembly and the set frames 150 and 160.

As described above, the set frames 150 and 160 can include the first support plate 150 on the left and the second support plate 160 on the right, and the first frame on the left and the second frame on the right, but the present disclosure is not limited thereto.

The first support plate 150 and the second support plate 160 can be separately provided to be folded independently of each other, and the hinge assembly can be provided therebetween.

The foldable display device according to an embodiment of the present disclosure can be implemented in an inner folding manner (e.g., folding onto itself) in which a screen unit is disposed internally (e.g., not exposed to the outside), when folded. Therefore, screen unit (e.g., display device 180) can be protected from damage caused by an external force, such as by dropping of the foldable display device 100.

In addition, the first support plate 150 and the second support plate 160 according to an embodiment of the present disclosure can be disposed in one area and the other area where the foldable display device is folded and unfolded.

The hinge assembly can include the hinge housing 210, the first and second hinge arms 230*a* and 230*b*, and the inner frame 220.

The hinge assembly can include the pair of hinge arms 230*a* and 230*b*, and the hinge arms 230*a* and 230*b* can include the first hinge arm 230*a* and the second hinge arm 230*b* having a structure in which they are symmetrical to each other.

The first hinge arm 230*a* and the second hinge arm 230*b* according to an embodiment of the present disclosure are characterized by having a biaxial folding (e.g., rotation) structure.

In addition, an embodiment of the present disclosure is characterized by having the two bevel gears 241*a* and 241*b* and the link slider structure for synchronization between axes during biaxial rotation.

In this case, the first bevel gear 241*a* and the second bevel gear 241*b* can include the second idle gears 232*b* that mesh with first idle gears 232*a* of the respective first hinge arm 230*a* and the second hinge arm 230*b* in order to convert and transmit rotation of each of the first hinge arm 230*a* and the second hinge arm 230*b* in a perpendicular direction (e.g., rotational direction). The first bevel gear 241*a* and the second bevel gear 241*b* are respectively rotatably fastened (e.g., or mesh or rotatably engage) to the first idle gears 232*a* of the first hinge arm 230*a* and the second hinge arm 230*b* through the second idle gears 232*b* of the first and second bevel gears 241*a*, 241*b*. The first hinge arm 230*a* and the second hinge arm 230*b* are slidably fastened to the first gear arm and the second gear arm, respectively, so that a folding operation and an unfolding operation of the foldable display device 100 can be performed while left and right synchronization (e.g., synchronization of the hinge assembly 200 and thus the display device 180 which is attached to the hinge assembly 200) is maintained.

In addition, an embodiment of the present disclosure is characterized in that the hinge support 250 in a "T" shape is disposed between the first gear arm and the second gear arm of the hinge assembly. Through the up/down method (e.g., vertical movement) of the hinge support 250, an escape structure for realizing (e.g., supporting) a curvature of the display panel 180 when folded is secured, and at the same time, the gear arms can be supported, thereby improving impact resistance properties of the foldable display device 200.

In addition, an embodiment of the present disclosure is characterized in that the foreign material inflow prevention elements 236*a* and 236*b* are interposed between the hinge housing 210 and the inner frame 220 of the hinge assembly.

The foreign material inflow prevention elements 236*a* and 236*b* can include the first foreign material inflow prevention elements 236*a* on a left (e.g., first lateral side) and the second foreign material inflow prevention elements 236*b* on a right (e.g., second lateral side), but the present disclosure is not limited thereto.

For instance, in the case of an inner folding manner in which a screen unit is disposed internally when the foldable display device is folded, foreign materials can flow into a gap between the hinge housing and the inner frame when the hinge assembly is folded. The flowing foreign material can interfere with an operation of the bevel gear or cam of the hinge assembly or, in severe cases, can cause damage.

In the case of the previous structure, it is difficult to manage gap dimensions due to assembly tolerance between the hinge housing and the inner frame, so it can be vulnerable to an inflow of foreign materials.

Accordingly, an embodiment of the present disclosure is characterized in that the first foreign material inflow prevention element 236*a* and the second foreign material inflow prevention element 236*b* are interposed between the hinge housing 210 and the inner frame 220 of the hinge assembly 200 and operate together with folding of the first hinge arm 230*a* and the second hinge arm 230*b* when the first hinge arm 230*a* and the second hinge arm 230*b* are folded, thereby blocking foreign materials from internally flowing after folding.

The first foreign material inflow prevention element 236*a* and the second foreign material inflow prevention element 236*b* are connected to the first hinge arm 230*a* and the second hinge arm 230*b*, respectively, and operate together with folding of the first hinge arm 230*a* and the second hinge arm 230*b* when the first hinge arm 230*a* and the second hinge arm 230*b* are folded, thereby blocking foreign materials from internally flowing after folding.

The first foreign material inflow prevention element 236*a* and the second foreign material inflow prevention element 236*b* can be fastened to the first hinge arm 230*a* and the second hinge arm 230*b*, respectively, through a method such as welding, soldering, adhesive bonding or any other type of bonding so that the first foreign material inflow prevention element 236*a* and the second foreign material inflow prevention element 236*b* operate simultaneously with movement/operation of the first hinge arm 230*a* and the second hinge arm 230*b*.

The first foreign material inflow prevention element 236*a* and the second foreign material inflow prevention element 236*b* can rotate while sliding along curvatures of an inside of the hinge housing 210 and the outside of the inner frame 220. To this end, the first foreign material inflow prevention element 236*a* and the second foreign material inflow prevention element 236*b* can be formed to have the curvature along the curvature of the outside of the inner frame 220. For instance, the first foreign material inflow prevention element 236a and the second foreign material inflow prevention element 236b can have a curvature that matches a curvature of the inner frame 220 to reduce gaps in the foldable display device 100, thereby preventing foreign such as dust material, or other contaminants, from entering the hinge assembly 200 or any other component of the foldable display device 100.

Rotation centers of the first foreign material inflow prevention element 236a and the second foreign material inflow prevention element 236b coincide with the rotation centers of the first hinge arm 230a and the second hinge arm 230b so that they can be folded together (refer to a dotted line in FIG. 6).

In an embodiment of the present disclosure, it is possible to block foreign materials from flowing internally by minimizing a gap through dimensional management (e.g., dimensional matching, shape matching, etc.) between components of the hinge assembly 200.

The embodiments of the present disclosure can also be described as follows:

According to an aspect of the present disclosure, there is provided a foldable display device. The foldable display device includes a first support plate and a second support plate, a display panel disposed on the first support plate and the second support plate and a hinge assembly disposed between the first support plate and the second support plate, the hinge assembly includes, a hinge arm, a gear arm coupled to the hinge arm, an inner frame disposed under the hinge arm and the gear arm and fixing the hinge arm and the gear arm, a hinge housing accommodating the inner frame, the hinge arm, and the gear arm, under the inner frame, and a foreign material inflow prevention element interposed between the hinge housing and the inner frame and connected to the hinge arm to operate together with folding of the hinge arm when the hinge arm is folded.

The hinge arm can include a first hinge arm and a second hinge arm rotatably connected to each other.

The gear arm can include a first gear arm and a second gear arm fastened to interlock with the first hinge arm and the second hinge arm.

The hinge assembly can include a first bevel gear and a second bevel gear respectively coupled to the first hinge arm and the second hinge arm in a perpendicular direction.

The display panel can perform a folding operation and an unfolding operation about a rotation axis different from central axes of the first bevel gear and the second bevel gear.

The first bevel gear and the second bevel gear can be disposed to mesh with each other, and the first bevel gear and the second bevel gear can respectively include second idle gears meshing with first idle gears of the first hinge arm and the second hinge arm.

The first idle gears and the second idle gears can be disposed in a direction perpendicular to each other.

The first hinge arm and the second hinge arm can rotate along with rotation of the first gear arm and the second gear arm, and left and right synchronization can be maintained by the first bevel gear and the second bevel gear which are connected to the first hinge arm and the second hinge arm, respectively.

The foldable display device can further include sliding pins protruding toward the first hinge arm and the second hinge arm at ends of the first gear arm and the second gear arm, respectively.

The sliding pins slidably can move along sliding spaces provided in the first hinge arm and the second hinge arm which face the first gear arm and the second gear arm during the folding operation and the unfolding operation.

The foldable display device can further include a pair of guide pins provided on an upper end of the inner frame and protruding toward the first hinge arm and the second hinge arm; and a pair of housing cover rails which are provided on the first hinge arm and the second hinge arm facing the pair of guide pins, and into which the pair of guide pins are fitted, wherein the first hinge arm and the second hinge arm can be folded (rotated) along a folding trajectory of the housing cover rail while being guided by the pair of guide pins.

The foreign material inflow prevention element can include a first foreign material inflow prevention element on a left and a second foreign material inflow prevention element on a right, and the first foreign material inflow prevention element and the second foreign material inflow prevention element can be separately provided to be folded independently of each other.

The first foreign material inflow prevention element and the second foreign material inflow prevention element can rotate while sliding along curvatures of an inside of the hinge housing and an outside of the inner frame.

Rotation centers of the first foreign material inflow prevention element and the second foreign material inflow prevention element can coincide with rotation centers of the first hinge arm and the second hinge arm, so that they rotate together, The first foreign material inflow prevention element and the second foreign material inflow prevention element can be formed such that a portion thereof in which the first gear arm and the second gear arm are disposed has a larger area than a portion thereof in which the first hinge arm and the second hinge arm are disposed.

The first foreign material inflow prevention element and the second foreign material inflow prevention element can have a central portion having a curvature along a curvature of an outside of the inner frame so that the inner frame is accommodated therein, and both sides of the first foreign material inflow prevention element and the second foreign material inflow prevention element on which the first gear arm and the second gear arm are disposed can have flat surfaces so that the first gear arm and the second gear arm are seated thereon.

Various embodiments described herein may be implemented in a computer-readable medium using, for example, software, hardware, or some combination thereof. For example, the embodiments described herein may be implemented within one or more of Application Specific Integrated Circuits (ASICs), Digital Signal Processors (DSPs), Digital Signal Processing Devices (DSPDs), Programmable Logic Devices (PLDs), Field Programmable Gate Arrays (FPGAs), processors, controllers, micro-controllers, microprocessors, other electronic units designed to perform the functions described herein, or a selective combination thereof. In some cases, such embodiments are implemented by the controller. For Example, the controller is a hardware-embedded processor executing the appropriate algorithms (e.g., flowcharts) for performing the described functions and thus has sufficient structure. Also, the embodiments such as procedures and functions may be implemented together with separate software modules each of which performs at least one of functions and operations. The software codes can be implemented with a software application written in any suitable programming language. Also, the software codes can be stored in the memory and executed by the controller, thus making the controller a type of special purpose controller specifically configured to carry out the described functions and algorithms. Thus, the components shown in the drawings have sufficient structure to implement the appropriate algorithms for performing the described functions.

Although the embodiments of the present disclosure have been described in detail with reference to the accompanying drawings, the present disclosure is not limited thereto and can be embodied in many different forms without departing from the technical concept of the present disclosure. Therefore, the embodiments of the present disclosure are provided for illustrative purposes only but not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A foldable display device, comprising:
    a first support plate;
    a second support plate;
    a display panel disposed on the first support plate and the second support plate; and
    a hinge assembly disposed between the first support plate and the second support plate, the hinge assembly including:
        a hinge arm;
        a gear arm coupled to the hinge arm;
        an inner frame disposed under the hinge arm and the gear arm and being fixed to at least one of the hinge arm and the gear arm;
        a hinge housing accommodating the inner frame, the hinge arm, and the gear arm; and
        a foreign material inflow prevention element disposed between the hinge housing and the inner frame and directly connected to the hinge arm to operate together with movement of the hinge arm,
    wherein the hinge arm includes a first hinge arm and a second hinge arm rotatably connected to the first hinge arm,
    wherein the foreign material inflow prevention element includes a first foreign material inflow prevention element on a first lateral side and a second foreign material inflow prevention element on a second lateral side,
    wherein a center of rotation of the first foreign material inflow prevention element coincides with a center of rotation of the first hinge arm, and
    wherein a center of rotation of the second foreign material inflow prevention element coincides with a center of rotation of the second hinge arm.

2. The foldable display device of claim 1, wherein the gear arm includes:
    a first gear arm fastened to the first hinge arm; and
    a second gear arm fastened to the second hinge arm.

3. The foldable display device of claim 2, wherein the hinge assembly further includes:
    a first bevel gear coupled to the first hinge arm; and
    a second bevel gear coupled to the second hinge arm.

4. The foldable display device of claim 3, wherein the display panel performs a folding operation and an unfolding operation about a rotation axis different from rotational axes of the first bevel gear and the second bevel gear.

5. The foldable display device of claim 3, wherein the first bevel gear meshes with the second bevel gear to synchronize movement of the first hinge arm and the second hinge arm, wherein the first bevel gear includes a second idle gear and the second bevel gear includes a second idle gear.

6. The foldable display device of claim 5, wherein the first hinge arm includes a first idle gear,
    wherein the second hinge arm includes a first idle gear,
    wherein the second idle gear of the first bevel gear meshes with the first idle gear of the first hinge arm, and
    wherein the second idle gear of the second bevel gear meshes with the first idle gear of the second hinge arm.

7. The foldable display device of claim 6, wherein a rotation direction of the second idle gears of the first bevel gear and the second bevel gear is perpendicular to a rotation direction of the first idle gears of the first hinge arm and the second hinge arm.

8. The foldable display device of claim 2, wherein each of the first hinge arm and the second hinge arm includes protrusion, and
    wherein each protrusion includes a sliding space.

9. The foldable display device of claim 8, wherein the first gear arm includes a sliding pin that extends into and slides within the sliding space of the first hinge arm during a folding operation and the unfolding operation of the display panel, and
    wherein the second gear arm includes a sliding pin that extends into and slides within the sliding space of the second hinge arm during the folding operation and the unfolding operation.

10. The foldable display device of claim 2, further comprising:
    a pair of guide pins provided on an upper end of the inner frame and protruding toward the first hinge arm and the second hinge arm; and
    a pair of housing cover rails receiving the pair of guide pins and provided on the first hinge arm and the second hinge arm,
    wherein the first hinge arm and the second hinge arm rotate along a folding trajectory of the housing cover rail while being guided by the pair of guide pins.

11. The foldable display device of claim 2,
    wherein the first foreign material inflow prevention element moves independently of the second foreign material inflow prevention element.

12. The foldable display device of claim 11, wherein the first foreign material inflow prevention element and the second foreign material inflow prevention element rotate while sliding along a curved inside surface of the hinge housing.

13. The foldable display device of claim 11, wherein the first foreign material inflow prevention element and the second foreign material inflow prevention element include a first portion and a second portion,
    wherein each of the first gear arm and the second gear arm are disposed on the first portion of a respective one of the first foreign material inflow prevention element and the second foreign material inflow prevention element,
    wherein each of the first hinge arm and the second hinge arm are disposed on the second portion of a respective one of the first foreign material inflow prevention element and the second foreign material inflow prevention element, and
    wherein for each of the first foreign material inflow prevention element and the second foreign material inflow prevention element, the first portion is larger than the second portion.

14. The foldable display device of claim 11, wherein the first foreign material inflow prevention element and the second foreign material inflow prevention element have a central portion having a curvature accommodating a curved outside surface of the inner frame, and
wherein the first foreign material inflow prevention element and the second foreign material inflow prevention element include flat surfaces seating a respective one of the first gear arm and the second gear arm.

15. A foldable display device, comprising:
a support plate including a groove formed along a longitudinal axis of the support plate;
a display panel disposed in the groove of the support plate; and
a hinge assembly disposed between the support plate and the display panel and at a lateral center of the support plate and including:
a hinge arm;
a gear arm coupled to the hinge arm;
an inner frame fixed to the hinge arm and the gear arm;
a hinge housing accommodating the inner frame, the hinge arm, and the gear arm; and
a foreign material inflow prevention element disposed between the hinge housing and the inner frame,
wherein the foreign material inflow prevention element is directly connected to the hinge arm to operate together with movement of the hinge arm,
wherein the hinge arm includes a first hinge arm and a second hinge arm rotatably connected to the first hinge arm,
wherein the foreign material inflow prevention element includes a first foreign material inflow prevention element on a first lateral side and a second foreign material inflow prevention element on a second lateral side,
wherein a center of rotation of the first foreign material inflow prevention element coincides with a center of rotation of the first hinge arm, and
wherein a center of rotation of the second foreign material inflow prevention element coincides with a center of rotation of the second hinge arm.

16. The foldable display device of claim 15, wherein the hinge arm includes:
a first hinge arm; and
a second hinge arm rotatably connected to the first hinge arm,
wherein the hinge assembly further includes:
a first bevel gear coupled to the first hinge arm; and
a second bevel gear coupled to the second hinge arm and meshing with the first bevel gear to synchronize movement of the first hinge arm and the second hinge arm.

17. The foldable display device of claim 16, wherein the first bevel gear includes a second idle gear and the second bevel gear includes a second idle gear,
wherein the first hinge arm includes a first idle gear,
wherein the second hinge arm includes a first idle gear,
wherein the second idle gear of the first bevel gear meshes with the first idle gear of the first hinge arm, and
wherein the second idle gear of the second bevel gear meshes with the first idle gear of the second hinge arm.

18. The foldable display device of claim 15,
wherein the first foreign material inflow prevention element and the second foreign material inflow prevention element rotate while sliding along a curved inside surface of the hinge housing.

19. The foldable display device of claim 18, wherein the first foreign material inflow prevention element and the second foreign material inflow prevention element have a central portion having a curvature accommodating a curved outside surface of the inner frame.

* * * * *